(12) United States Patent
Liu et al.

(10) Patent No.: US 8,222,081 B2
(45) Date of Patent: Jul. 17, 2012

(54) WAFER LEVEL BUCK CONVERTER

(75) Inventors: Yong Liu, Scarborough, ME (US); Qi Wang, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/342,446

(22) Filed: Jan. 3, 2012

(65) Prior Publication Data

US 2012/0100670 A1 Apr. 26, 2012

Related U.S. Application Data

(62) Division of application No. 12/262,570, filed on Oct. 31, 2008, now Pat. No. 8,102,029.

(51) Int. Cl.
*H01L 21/00* (2006.01)
(52) U.S. Cl. ............... 438/109; 257/621; 257/E21.511; 257/E23.079
(58) Field of Classification Search .............. 257/621, 257/E21.511, E23.079; 438/109
See application file for complete search history.

(56) References Cited

U.S. PATENT DOCUMENTS

| | | | |
|---|---|---|---|
| 6,222,352 B1 | 4/2001 | Lenk | |
| 6,882,030 B2 | 4/2005 | Siniaguine | |
| 6,903,012 B2 | 6/2005 | Geefay et al. | |
| 6,924,551 B2 | 8/2005 | Rumer et al. | |
| 2003/0210020 A1 | 11/2003 | Zhang | |
| 2006/0132113 A1 | 6/2006 | Cha et al. | |
| 2006/0273455 A1 | 12/2006 | Williams et al. | |
| 2007/0222050 A1 | 9/2007 | Lee | |
| 2008/0079121 A1 | 4/2008 | Han | |
| 2008/0081398 A1 | 4/2008 | Lee et al. | |
| 2008/0153187 A1 | 6/2008 | Luo et al. | |
| 2008/0157287 A1 | 7/2008 | Choi et al. | |

OTHER PUBLICATIONS

ISR and Written Opinion of corresponding PCT Application (PCT/US2009/058927) dated May 3, 2010 (6 pgs.).
Vardaman, E. Jan, "3-D Through-Silicon Vias Become a Reality", article found on www.semiconductor.net/article/CA6445435.html, as printed from Internet on Sep. 12, 2008, Article dated Jun. 1, 2007—Semiconductor International, pp. 1 through 7.
Shimamoto, H., Technical Trend 3D Chip Stacked MCP/SiP, Electronic Components and Technology Conference, 2007, pp. 1 through 32.

*Primary Examiner* — Zandra Smith
*Assistant Examiner* — Marvin Payen
(74) *Attorney, Agent, or Firm* — Hiscock & Barclay, LLP

(57) ABSTRACT

A buck converter module includes a high side (HS) die having source, drain, and gate bonding pads on a front side of the HS die, a low side (LS) die having a first section thereof with a plurality of through silicon vias (TSVs) extending from a back side to a front side of the LS die, the LS die having source, drain, and gate bonding pads located on a front side of a second section separate from the first section, the drain bonding pad electrically connected to the back side of the LS die in the second section. The HS die and the LS die are bonded together such that the source bonding pad of the HS die is electrically connected to the back side of the LS die, and each of the drain and gate bonding pads are electrically connected to separate TSVs in the LS die.

14 Claims, 8 Drawing Sheets

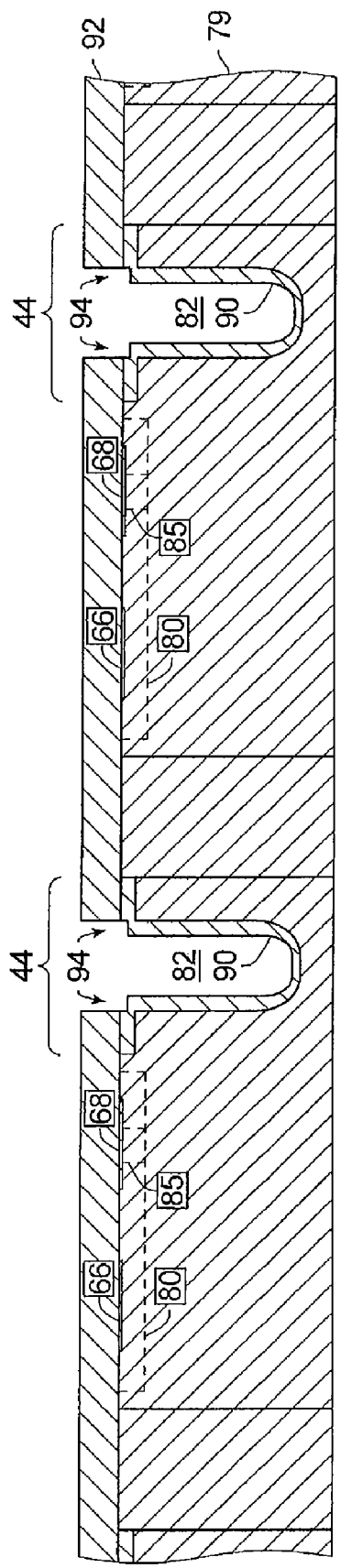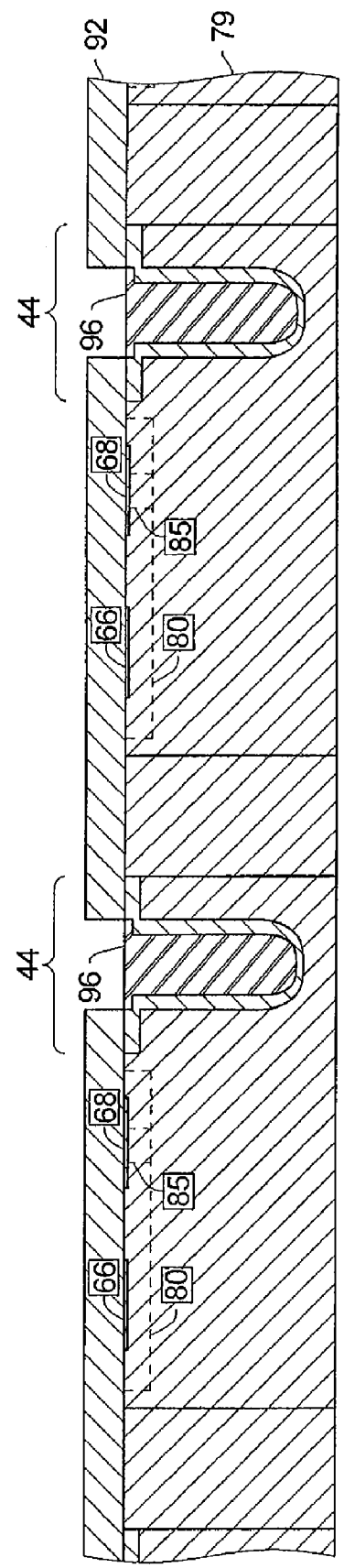

US 8,222,081 B2

WAFER LEVEL BUCK CONVERTER

CROSS-REFERENCE TO RELATED APPLICATIONS

This application is a divisional of U.S. patent application Ser. No. 12/262,570 filed Oct. 31, 2008, the specification of which is hereby incorporated by reference in its entirety.

FIELD OF THE INVENTION

This invention relates to synchronous buck converters, and more particularly to multiple die synchronous buck converters.

BACKGROUND OF THE INVENTION

Synchronous buck converters, primarily used in step-down power supply circuits, typically include two switching field effect transistors (FETs) and a series inductor to permit digital, rather than analog, control of the FETs which either supply current into the inductor or draw current back from the inductor. Compared to analog power supplies, the synchronous buck converter with FET switching transistors are small and use very little overhead current. Thus they are often used for mobile electronic devices. Since space is an important consideration in such devices, the size of synchronous buck converters is important in the marketplace.

SUMMARY OF THE INVENTION

The invention comprises, in one form thereof, a buck converter module including a high side (HS) die having source, drain, and gate bonding pads on a front side of the HS die, a low side (LS) die having a first section thereof with a plurality of through silicon vias (TSVs) extending from a back side to a front side of the LS die, the LS die having source, drain, and gate bonding pads located on a front side of a second section separate from the first section, the drain bonding pad electrically connected to the back side of the LS die in the second section. The HS die and the LS die are bonded together such that the source bonding pad of the HS die is electrically connected to the back side of the LS die, and each of the drain and gate bonding pads are electrically connected to separate TSVs in the LS die.

In still another form, the invention includes a method for making a buck converter module. The method comprises the steps of forming a high side (HS) die having source bonding pads on a front side of the HS die in a first section of the HS die and having a drain and gate bonding pad on the first side of a second section of the HS die, forming a low side (LS) die having source, drain, and gate bonding pads on a front side of the LS die in a first section of the LS die, the front side of the LS die having a back side opposite the front side of the LS die with a drain connection at the back side of the LS die in the first section, forming a plurality of through silicon vias (TSVs) in a second section of the LS die, the TSVs extending from the front side to the back side of the LS die, and electrically connecting the source bonding pads of the HS die to the drain connection at the back side of the LS die, and connecting the drain and gate bonding pads of said HS die to ends of the TSVs on the back side of the LS die.

BRIEF DESCRIPTION OF THE DRAWINGS

The aforementioned and other features, characteristics, advantages, and the invention in general will be better understood from the following more detailed description taken in conjunction with the accompanying drawings, in which:

FIGS. 5A, 5B, 5C, 5D, 5E, 5F, 5G, and 5H show selected processing stages in the making of the low side MOSFET shown in FIG. 2;

Figure 1:
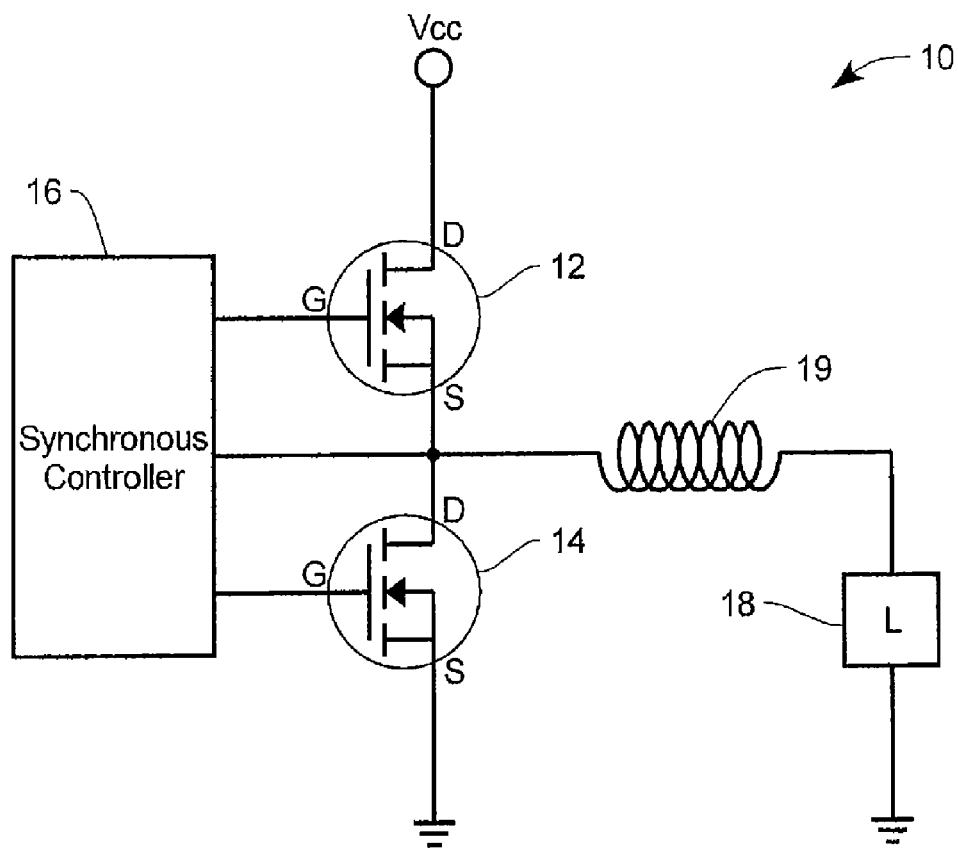
FIG. 1 is a schematic diagram of a synchronous buck converter which includes an high side MOSFET and a low side MOSFET.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Turning now to the drawings, FIG. 1 is a schematic diagram of a synchronous buck converter 10 which includes an high side MOSFET 12 and a low side MOSFET 14, the gates of which are driven by a synchronous controller 16. A load 18 is coupled through an inductor 19 to the common node of the source of the high side MOSFET 12 and the drain of the low side MOSFET 14. Although the MOSFETs 12 and 14 are N channel devices, the present invention is applicable to P channel devices, and also to complementary N and P channel devices for the MOSFETs 12 and 14.

Figure 2:
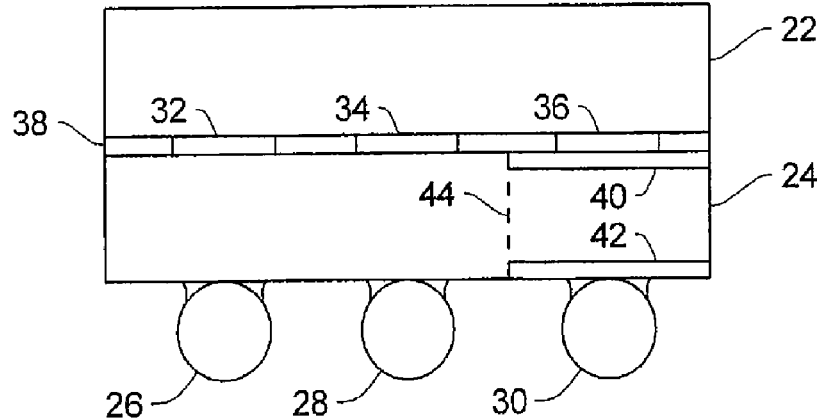
FIG. 2 is a side view of a wafer level buck converter module according to an embodiment of the present invention which includes the high side MOSFET and the low side MOSFET shown in FIG. 1.

FIG. 2 is a side view of a wafer level buck converter module 20 according to an embodiment of the present invention, which includes the high side MOSFET 12 and the low side MOSFET 14 shown in FIG. 1. Both the high side (HS) die 22 of the high side MOSFET 12 and the low side (LS) die 24 of the low side MOSFET 14 are flipped with the active regions at the bottom sides of the two die 22, 24. Shown in FIG. 2 are two solder bumps, 26 and 28, connected to drain bonding pads of the LS die 24, and a third solder bump 30 connected to the gate of the HS die 22 by a through silicon via (TSV) 46. Nine metal plates, which may be copper studs or gold bumps, have been formed on the bonding pads of the HS die 22. Two of the metal plates, 32 and 34, connect to source bonding pads of the HS die 22, and metal plate 36 connects to the gate bonding pad of the HS die 22. Between the HS die 22 and the LS die 24 is an anisotropic conductive film (ACF) 38 which electrically connects six of the metal plates, including metal plates 32 and 34, to the drain of the LS die 24 and electrically connects three additional metal plates, including metal plate 36, to three TSVs in the LS die 24.

Figure 4A:
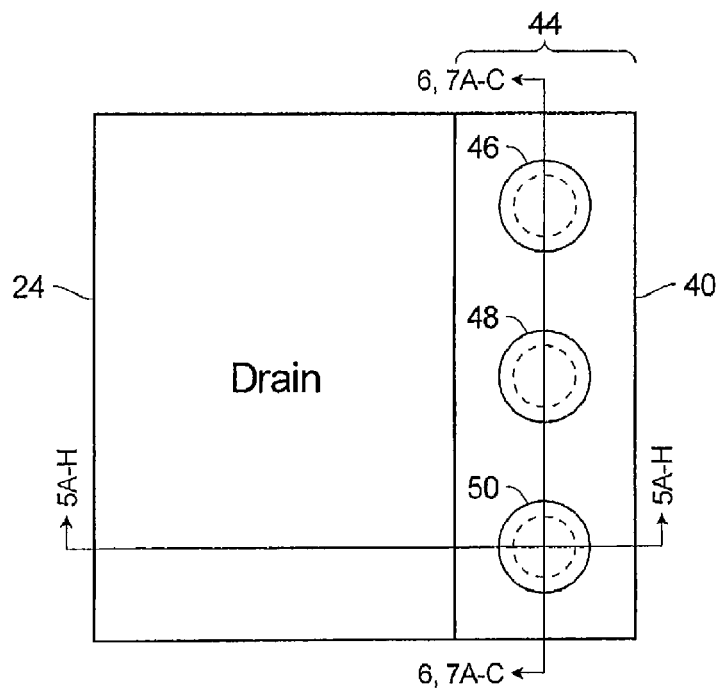
FIGS. 4A, 4B, and 4C are respective top, side, and bottom views of the low side MOSFET shown in FIG. 2.
Figure 4B:
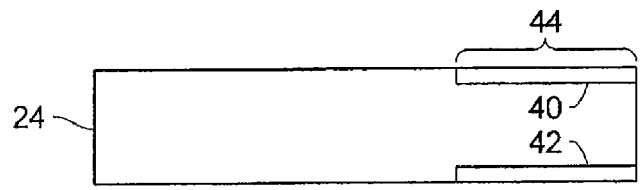
Figure 4C:
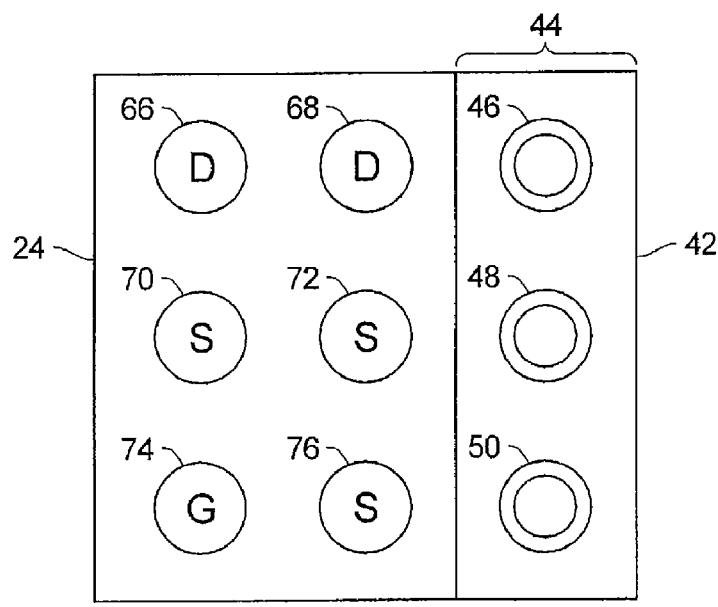

The right portion of the LS die 24, extending between two dielectric layers 40 and 42, in the TSV region 44 of the LS die 24 and contains the three TSVs 46, 48 and 50 shown in FIGS. 4A and 4C. The active region of the LS die 24 does not extend into the TSV region 44.

Figure 3A:
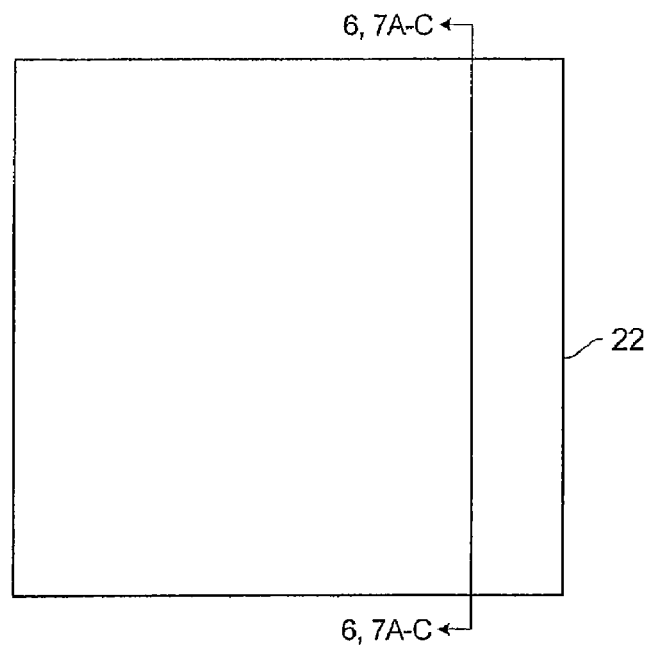
FIGS. 3A, 3B, and 3C are respective top, side, and bottom views of the high side MOSFET shown in FIG. 2.
Figure 3B:
Figure 3C:
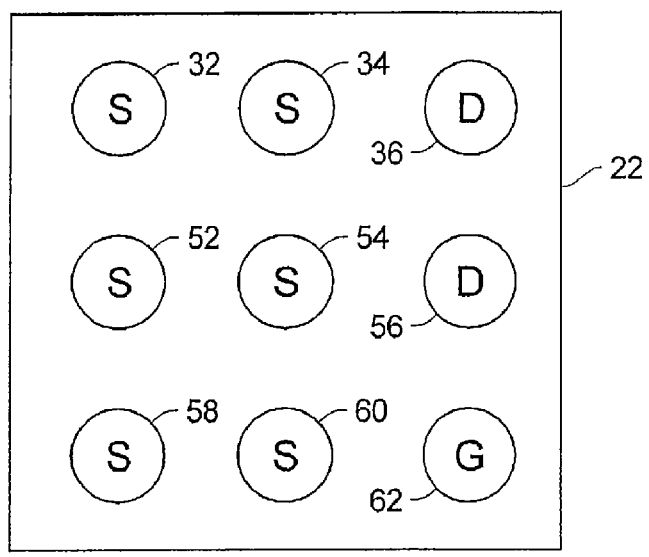

FIGS. 3A, 3B, and 3C are respective top, side, and bottom views of the HS die 22 showing nine plates 32, 34, 36, 52, 54, 56, 58, 60, and 62, three of which are shown in FIG. 2. The top surface of the HS die 22, shown in FIG. 3A, may be a drain region of the MOSFET 12, may be isolated entirely from the MOSFET 12, or may be connected to an active region of the MOSFET 12 other than the drain. The side view of FIG. 3B includes the three plates 32, 34, and 36. The respective MOSFET terminals connected to the plates of the HS die 22 are indicted by the letters "S", "D", and "G" indicating the source, drain, and gate of the HS MOSFET 12 in the embodiment shown in FIG. 3C.

FIGS. 4A, 4B, and 4C are respective top, side, and bottom views of the LS die 24 showing three TSVs 46, 48, and 50, and six bond pads 66, 68, 70, 72, 74, and 76 shown in FIG. 2. The respective bond pads of the LS die 24 are indicted by the letters "S", "D", and "G" indicating the source, drain, and gate bond pads of the LS MOSFET 14 in the embodiment shown in FIG. 4C. Also shown in FIGS. 4A-4C are the upper and lower dielectric layers 40 and 42 in the TSV region 44 of the LS die 24.

FIGS. 5A-5H show selected processing stages in the making of the LS die 24 shown in FIG. 2 while still in a wafer 79, and show cross sections of two LS dies 24 each taken along the line 5A-H-5A-H shown in FIG. 4A. FIGS. 5A-5H show one method of forming the TSVs 44, however alternative methods may also be used such as those shown in Shimamoto, H., Technical Trend of 3D Chip Stacked MCP/SiP, Electronic Components and Technology Conference, 2007.

Figure 5A:
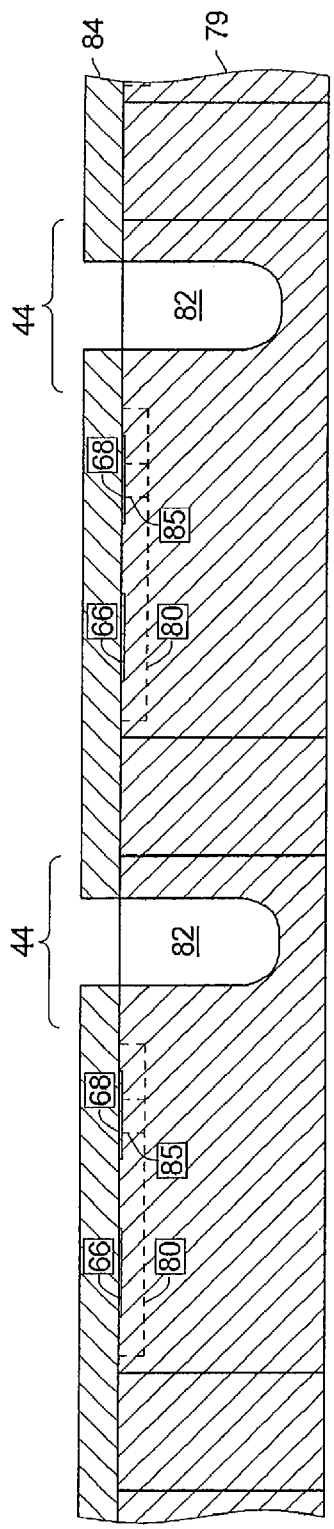
Figure 5B:
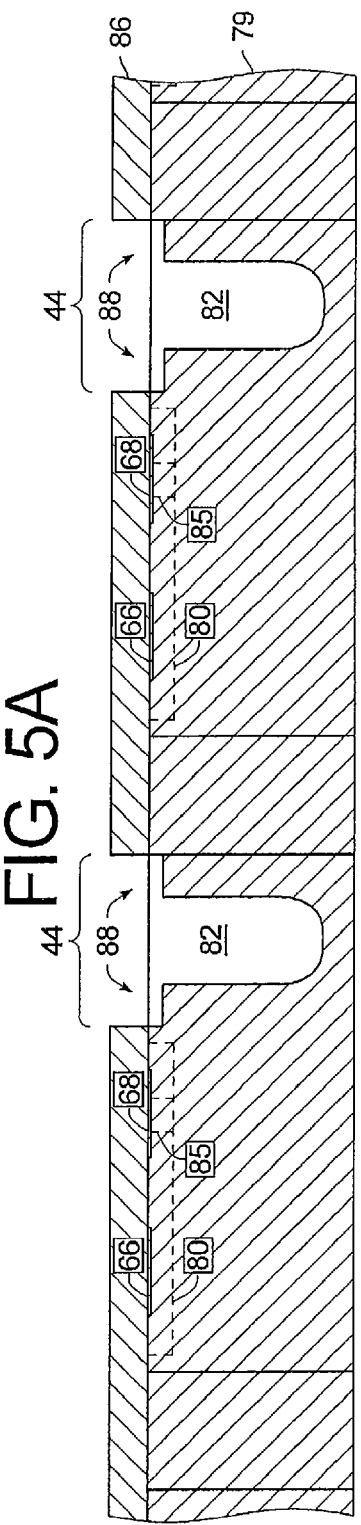
Figure 5C:
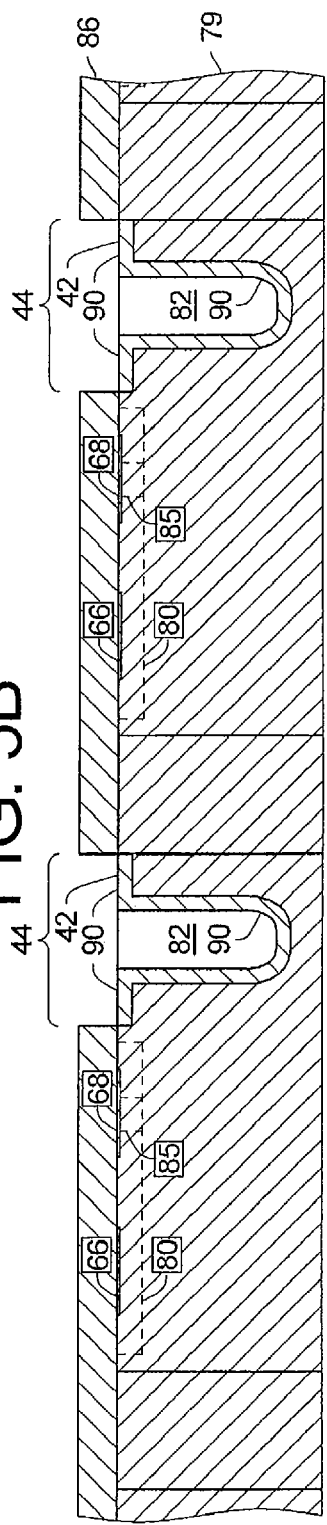

Turning now to FIG. 5A, the active region of the LS die 24, indicated by the dashed line 80, has been completed, and trenches 82 have been formed in the TSV region 44 using a first mask 84. A connection between the drain bonding pad 68 and the portion of the wafer 79 outside of the active area 80, as indicated by the dashed line 85, forms a connection between the drain bonding pads 66, 68 and the backside of the LS die 24. In FIG. 5B the first mask 84 is replaced with a second mask 86 and an etch process forms recessed regions 88 in the upper surface of the LS die 22 adjacent the trenches and also deepens the trenches 82. A deposition process, such as the deposition of a PECVD dielectric film or a SACVD dielectric film or similar process, is performed using the same second mask 86 to form dielectric layers 90 along the walls and bottoms of the trenches 82 and to fill the recessed regions 88 which form the dielectric layers 42 shown in FIG. 2. The mask 86 in FIG. 5C is replaced with a third mask 92 as shown in FIG. 5D, and another set of recesses 94, which are narrower than the recesses 88, are etched in the top surfaces of the trench dielectric layers 90 and adjacent the inner surfaces of the trench dielectric layers 90. Metallization 96 is deposited in the trenches 82 and the recesses 94 using the same mask 92 as shown in FIG. 5E.

Figure 5F:
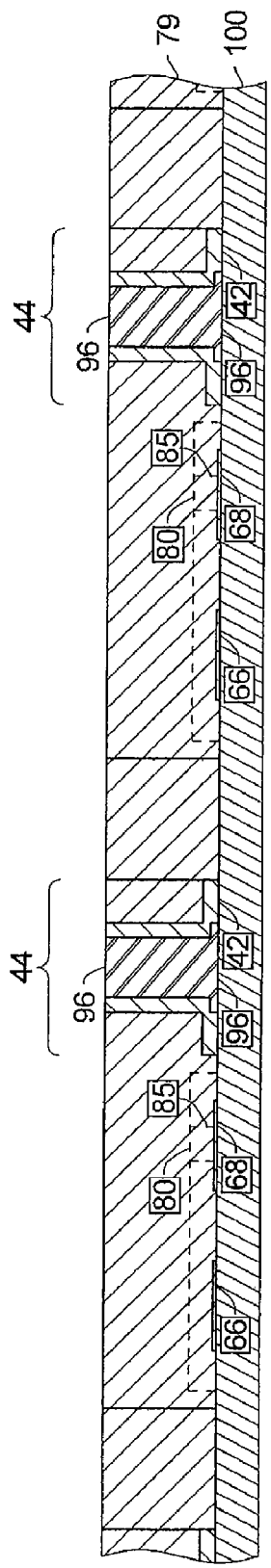
Figure 5G:
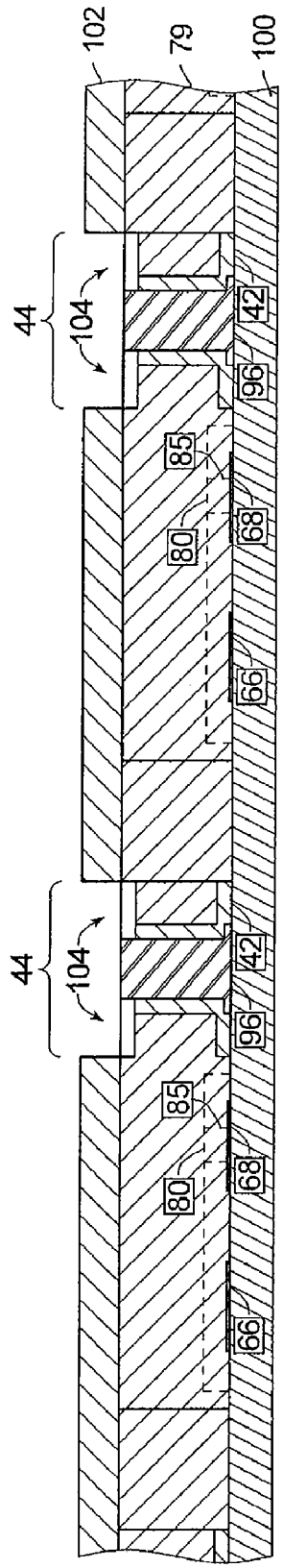

FIG. 5F shows the wafer 79 turned upside down after the third mask 92 has been removed, a protective tape 100 has been applied to the top of the LS dies 24, and the backside of the wafer 79 has undergone a backgrinding operation to thin the wafer 79 and expose the metallization 96 on the backside of the wafers 79. Using a fourth mask 102, an etch process forms recessed regions 104 in the backside surface of the LS die 22 adjacent the metallization 96 as shown in FIG. 5G. Then, as shown in FIG. 5H, an oxidation process using the same fourth mask 102 fills the recessed regions 104 with dielectric material 106, which may be same material deposited to form the dielectric layers 90 and 42, to form the dielectric layers 40 shown in FIG. 2.

Figure 6:
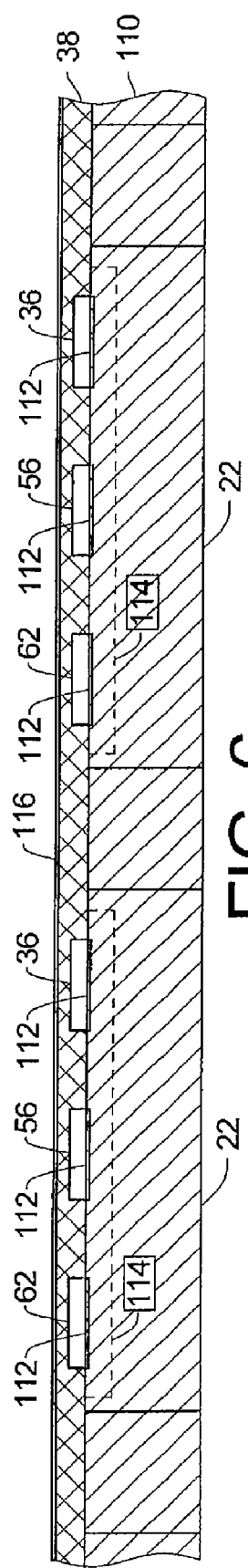
FIG. 6 is shows a processing stage in the making of the high side MOSFET shown in FIG. 2.

FIG. 6 shows portions of a HS wafer 110 that includes cross sections of two HS die 22, each taken along line 6, 7A-7C-6, 7A-7C in FIG. 3A with the metal plates 36, 56, and 62 attached to bonding pads 112 of the HS die 22. The ACF film 38 with a release film 116 on top has been applied to the front side, the side containing the active regions which are within the dashed outline 114, of the wafer 110 and the metal plates 36.

Figure 5H:
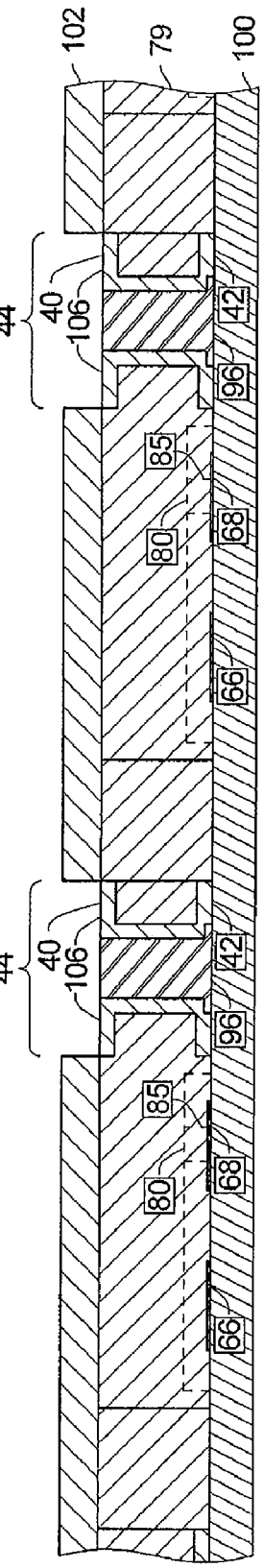
Figure 7A:
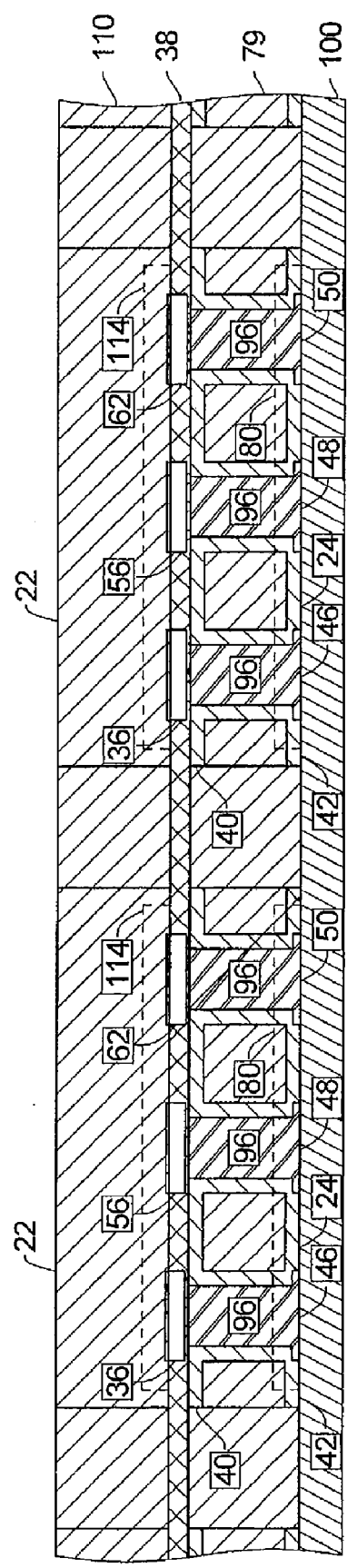
FIGS. 7A, 7B, and 7C show selected processing stages during the assembly of the low side MOSFET and high side MOSFET to form the wafer level buck converter module shown in FIG. 2
Figure 7B:
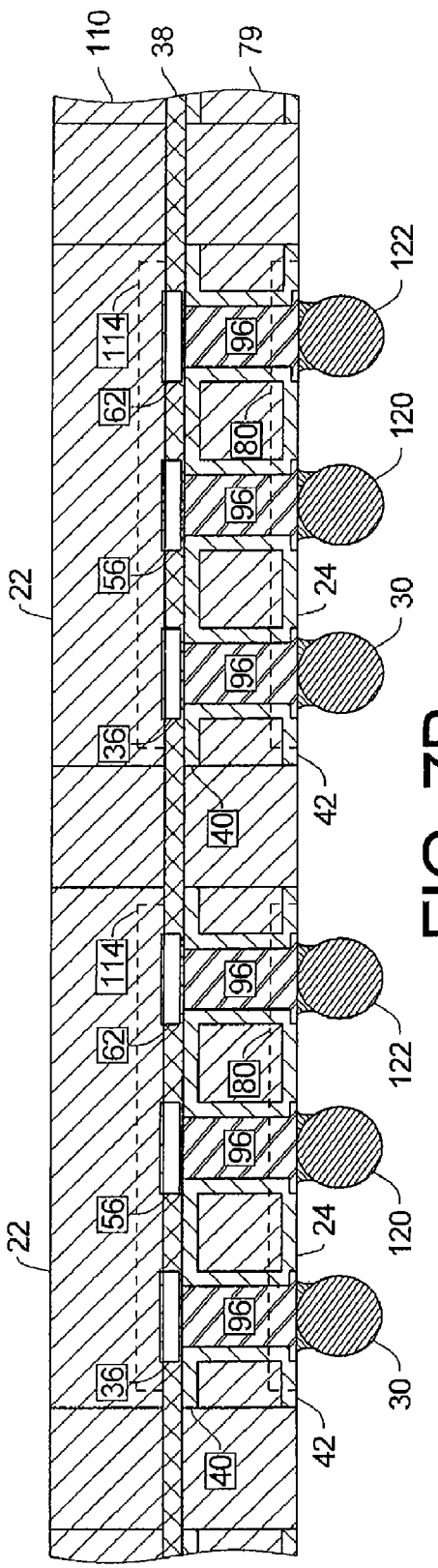
Figure 7C:
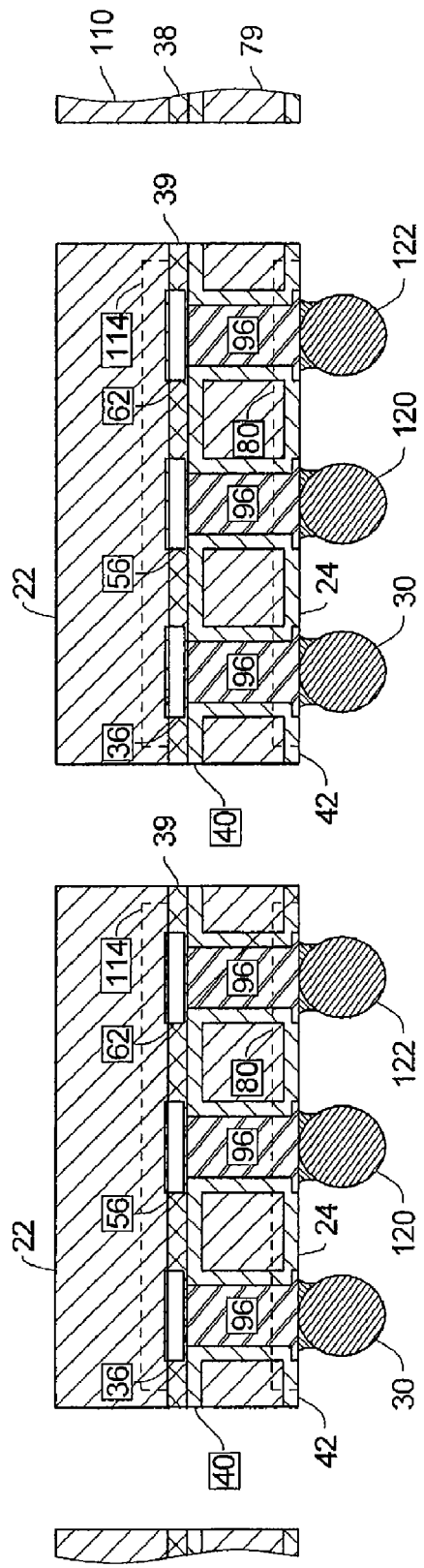

FIGS. 7A-7C show portions of the LS wafer 79 shown in FIG. 5H and the HS wafer 110 shown in FIG. 6 after the release film 116 has been removed from the ACF 38 and the HS wafer 110 has been flipped and aligned with the LS wafer 79. FIG. 7A shows the two wafers after they have been thermally compressed at a curing onset temperature of about 110° C. to bond the two wafers together with the ACF 38. FIG. 7B shows the two wafers 79, 110 after the protective tape on the front side of the LS wafer 79 is removed, and all of the bonding pads 66, 68, 70, 72, 74, and 76 and the TSVs 46, 48, and 50 have been solder bumped. Solder bumps 30 and 120 are connected to the drain of the high side MOSFET 12 through the TSVs 46 and 48, respectively, and solder bump 122 is connected to the gate of the high side MOSFET 12 through the TSV 50. FIG. 7C shows two individual wafer scale buck modules 20 after the bonded wafers have been singulated.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A method of making a buck converter module comprising the steps of:
    forming a high side (HS) die having source bonding pads on a front side of said HS die in a first section of said HS die and having a drain and gate bonding pad on said first side of a second section of said HS die;
    forming a low side (LS) die having source, drain, and gate bonding pads on a front side of said LS die in a first section of said LS die, said front side of said LS die having a back side opposite said front side of said LS die with a drain connection at said back side of said LS die in said first section;
    forming a plurality of through silicon vias (TSVs) in a second section of said LS die, said TSVs extending from said front side to said back side of said LS die; and
    electrically connecting said source bonding pads of said HS die to said drain connection at said back side of said LS die, and connecting said drain and gate bonding pads of said HS die to ends of said TSVs on said back side of said LS die.

2. The method set forth in claim 1 wherein said electrical connections between said HS die and said LS die are made with a anisotropic conductive film which also bonds together said HS die and said LS die.

3. The method set forth in claim 1 further comprising the step of attaching solder bumps to said bonding pads on said LS die and to said TSVs on said front side of said LS die.

4. The method set forth in claim 1 wherein said electrical connections between said HS die and said LS die includes metal plates attached to said source, drain, and gate bonding pads of said HS die.

5. The method set forth in claim 4 wherein said metal plates comprise one of copper studs and gold bumps.

6. The method set forth in claim 1 wherein said TSVs on the front side of said LS die have a larger surface area than said TSVs on said back side of the LS die.

7. The method set forth in claim 1 wherein sides of said TSVs are electrically insulated from the rest of said LS die.

8. The method set forth in claim 1 wherein electrically insulating material is formed is said front and back side surfaces in said second section of said LS die which extends between said TSVs and to three sides of said LS die.

9. A method of making a buck converter module comprising the steps of:
   forming in a high side (HS) die wafer having at least two spaced apart HS dies, each of said HS dies having source bonding pads on a front side of each of said HS dies in a first section of each of said HS dies and having a drain and gate bonding pad on said first side of a second section of each of said HS dies;
   forming in a low side (LS) die wafer having at least two spaced apart LS dies, each of said LS dies having source, drain, and gate bonding pads on a front side of each of said LS dies in a first section of each of said LS dies;
   forming a plurality of trenches into said front side in a second section of each of said LS dies;
   removing a first portion of each wafer around each of said plurality of trenches on said front side of said LS die wafer;
   oxidizing said trenches and said first portions around said trenches;
   filling said trenches with metallization;
   Thinning said LS die wafer by removing semiconductor material from the back side of said LS die wafer such that said metallization filled trenches are exposed on a backside of said LS die wafer, each of said LS dies having a drain connection at each of said back sides of said LS die wafer in each of said first sections;
   removing a second portion of each wafer around each of said plurality of trenches on said back side of said LS die wafer and oxidizing each of said second portions;
   Attaching said HS die wafer to said LS die wafer such that said source bonding pads of each of said HS dies are electrically connected to said first section in said back side of a corresponding LS die, and said drain and gate bonding pads of each of said HS dies are electrically connected to one of said metallization filled trenches is said second section of said corresponding LS die.

10. The method set forth in claim 9 wherein said electrical connections between said HS dies and said LS dies is made with an anisotropic conductive film which also bonds together said HS die wafer and said LS die wafer.

11. The method set forth in claim 9 further comprising the step of attaching solder bumps to said bonding pads on said LS dies and to said metallization filled trenches on said front side of said LS dies.

12. The method set forth in claim 9 wherein said electrical connections between said HS dies and said LS dies includes metal plates attached to said source, drain, and gate bonding pads of each of said HS dies.

13. The method set forth in claim 12 wherein said metal plates comprise one of copper studs and gold bumps.

14. The method set forth in claim 9 wherein said first and second oxidized portions of each of said LS dies cover said front sides and said back sides of said second sections in said LS dies.

* * * * *